United States Patent [19]

Kinoshita

[11] Patent Number: 4,475,178

[45] Date of Patent: Oct. 2, 1984

[54] SEMICONDUCTOR REGENERATION/PRECHARGE DEVICE

[75] Inventor: Hiroyuki Kinoshita, Tokyo, Japan

[73] Assignee: Tokyo Shibaura Denki Kabushiki Kaisha, Kawasaki, Japan

[21] Appl. No.: 327,225

[22] Filed: Dec. 3, 1981

[30] Foreign Application Priority Data

Dec. 4, 1980 [JP] Japan .................................. 55-171309

[51] Int. Cl.³ .............................................. G11C 7/00
[52] U.S. Cl. .................................... 365/203; 365/205; 365/222
[58] Field of Search ................. 365/203, 205, 189, 222

[56] References Cited

U.S. PATENT DOCUMENTS 3,514,765  5/1970  Christensen .
3,679,472  7/1972  Wahlstrom .
4,028,557  6/1977  Wilson ................................. 365/205
4,070,590  1/1978  Ieda et al. ............................ 365/203

OTHER PUBLICATIONS

Ellis et al., "Controlled Gate Bit Line Boost Circuit", IBM Tech. Disc. Bul., vol. 24, No. 7B, 12/1981, pp. 3820–3822.

Primary Examiner—Stuart N. Hecker
Attorney, Agent, or Firm—Finnegan, Henderson, Farabow, Garrett & Dunner

[57] ABSTRACT

A semiconductor device includes: a pair of first and second data lines charged to a predetermined potential during a precharge period; a sense amplifier for sensing the potential of the pair of data lines during an active period; and a regeneration circuit which charges the first and second data lines to the predetermined potential and maintain the potential of the higher potential data line after the sense amplifier senses during the active period.

16 Claims, 20 Drawing Figures

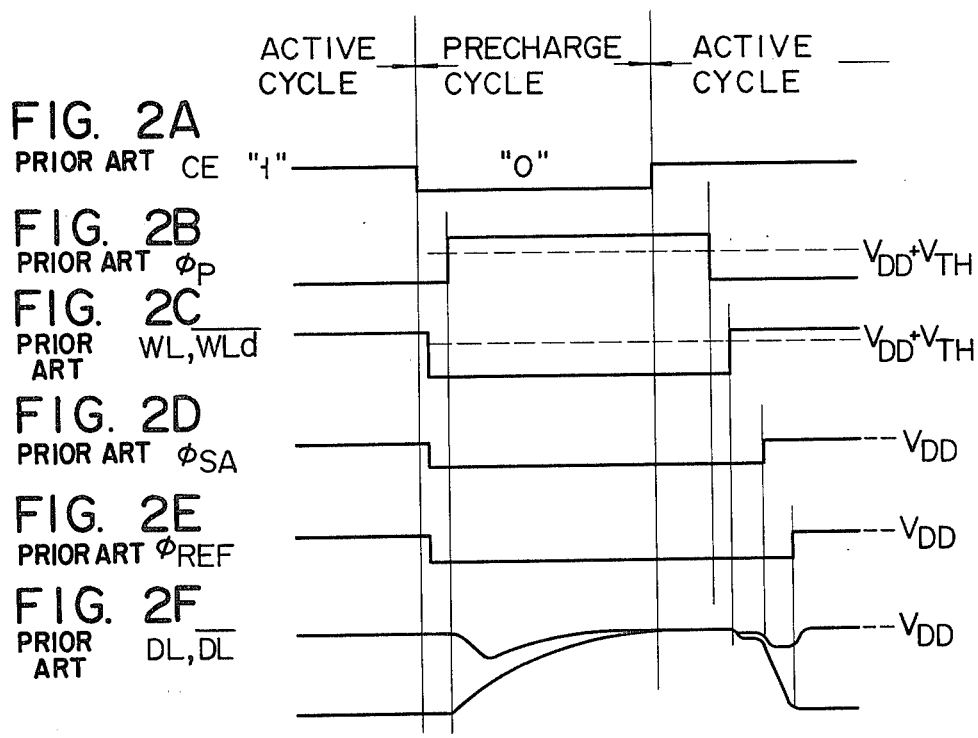
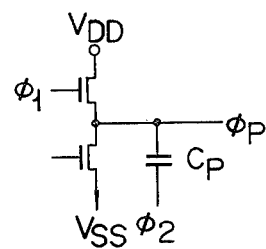
FIG. 3
PRIOR ART

SEMICONDUCTOR REGENERATION/PRECHARGE DEVICE

BACKGROUND OF THE INVENTION

The present invention relates to a semiconductor memory device and, more particularly, to a MOS (metal oxide semiconductor) type dynamic memory device.

In the MOS type dynamic memory device, as an example of a semiconductor memory device, one transistor/cell type memory device in which a single transistor and a single capacitor are used as a memory cell has dominantly been used aiming at improving a density of integration. In the MOS type dynamic memory device using such memory cells, different signal voltages appearing on a pair of data lines are very small (e.g. about several tens of mV) since the memory cell per se has no amplifying function. To sense such a minute signal, a sense amplifier is used. For accurately sensing the signal voltage by the sense amplifier, prior to the sensing operation by the sense amplifier, the potentials (referred to as initial potentials) on the pair of data lines must be set at the same level.

FIG. 1 shows a circuit construction of a part of a general MOS type dynamic memory device which is related to the present invention.

As shown, a pair of data lines DL and $\overline{DL}$ are connected to a sense amplifier SA. Coupled with the data lines DL and $\overline{DL}$ are regeneration circuits RC and $\overline{RC}$, a plurality of memory cells (only a couple of memory cells are illustrated, for simplicity), and dummy cells DC and $\overline{DC}$. Word lines WL and $\overline{WL}$ are coupled with the memory cells MC and $\overline{MC}$, respectively. The dummy cells DC and $\overline{DC}$ are also coupled with word lines WLd and $\overline{WLd}$, respectively.

The operation of the dynamic memory device as mentioned above will be described referring to FIGS. 2A to 2F. Assume now that a chip enable signal CE (FIG. 2A) is level-shifted from "1" to "0" and the operation phase shifts from an active cycle to a precharge cycle. Through this transient, the word line WL and dummy word line $\overline{WLd}$ (FIG. 2C) having been activated in the active cycle, the drive pulse $\phi_{SA}$ (FIG. 2D) to the sense amplifier SA, and the regeneration pulse $\phi_{REF}$ (FIG. 2E) go to "0" level. Then, the precharge pulse $\phi_p$ (FIG. 2B) goes to "1". When the precharge pulse $\phi_p$ is at "1" level, the data line DL and $\overline{DL}$ are precharged through transistors T1, T2 and T3 of the sense amplifier SA, while at the same time the data lines DL and $\overline{DL}$ are short circuited through the transistors T2 and T3. As a result, the data lines DL and $\overline{DL}$ are set at the same potential (FIG. 2F). In this case, the data lines DL and $\overline{DL}$ are generally charged up to the maximum voltage $V_{DD}$, i.e. the power source voltage, for reducing the stray capacitors associated with the data lines or for ensuring the regeneration of the signal voltages on the data lines which will be performed in the succeeding stage.

To this end, the voltage of the precharge pulse $\phi_p$ corresponding to "1" level is set at least at $V_{DD}+V_{TH}$ ($V_{TH}$ designates the threshold voltage of each of the transistors T2 and T3). The transistors T7 of the dummy cells DC and $\overline{DC}$ are also turned on, so that the charge stored in the capacitors Csd of the dummy cells DC and $\overline{DC}$ are discharged, and the potential stored in the capacitors Csd is a power source voltage $V_{SS}$ ("0" level).

Then, the chip enable pulse CE becomes "1" in level and the operation phase enters the active cycle. In this case, to secure the satisfactory charge into the data lines DL and $\overline{DL}$ and to ensure the setting of the initial potentials on the data lines to the same value, the precharge pulse $\phi_p$ is kept at "1" level for a while after the chip enable pulse CE becomes "1" in level and the active cycle starts. The precharge pulse $\phi_p$ becomes "0", and then one selected word line WL on the data line DL side (the number of word lines WL in a memory of 16 K bits is 128) and the dummy word line $\overline{WLd}$ on the opposite data line $\overline{DL}$ side are "1" in level ("1" level on the word lines WL and $\overline{WL}$ is set at $V_{DD}+V_{TH}$ or more). Subsequently, the charge stored in the capacitors Cs and Csd in the memory cell MC and dummy cell $\overline{DC}$ which are connected to the selected word lines WL and the dummy word line $\overline{WLd}$, respectively, are read out onto the data lines DL and $\overline{DL}$, respectively.

At this time, a signal voltage caused by the charge given in accordance with a capacitance ratio of the stray capacitor Cs in the memory cell MC and the stray capacitor $C_D$ associated with the data line DL, appears on the data line DL. In this case, the capacitance of the stray capacitor $C_D$ is considerably larger than that of the capacitor Cs, $C_D >> Cs$, so that the signal voltage appearing on the data line DL is extremely low. Since the capacitance of the capacitor Csd in the dummy cell $\overline{DC}$ is approximately ½ that of the capacitor Cs in the memory cell MC, there appears on the data line $\overline{DL}$ a voltage corresponding to an approximately ½ that between "1" level and "0" level on the data line DL.

The stored data in the memory cell MC may be detected through the comparison of the magnitudes of those signal voltages on the data lines DL and $\overline{DL}$ by the cross-connected transistors T4 and T5 in the sense amplifier SA. The sensing operation by the sense amplifier follows. When the drive pulse $\phi_{SA}$ (FIG. 2D) for the sense amplifier is "1" in level, the transistor T6 is turned on to in turn operate the transistors T4 and T5. As a result, the potential only on the lower potential data line of the data lines DL and $\overline{DL}$ drops to "0" in level, and the potential on the higher potential data line is kept as it is so that the signal voltage on the higher potential data line is amplified.

The signal voltage on the higher potential data line is actually very low. For this reason, even if the sense amplifier used is very sensitive, the potential on the higher potential data line drops at the operation time. Then, the potential drop on the data leads line is compensated for by the regeneration circuits RC and $\overline{RC}$. The connection points Na and Nb in the regeneration circuits RC and $\overline{RC}$ are charged when the data lines DL and $\overline{DL}$ are charged in the precharge cycle.

The regeneration circuit RC (or $\overline{RC}$), connected to the data line discharged through the operation of the sense amplifier SA by, for example, DC (or $\overline{DC}$), is not operated even when the regeneration pulse $\phi_{REF}$ (FIG. 2E) is "1", because the connection point Na (or Nb) is also discharged. In this situation, the higher potential data line, or the data line not discharged, for example, $\overline{DL}$ (or DL), is still at higher potential even though the potential on that line is dropped. Therefore, the gate source voltage of a barrier transistor T8b (or T8a) in the regeneration circuit $\overline{RC}$ (or RC) is the threshold voltage or slightly less, so that the barrier transistor T8b (or T8a) is kept off or substantially off. Accordingly, the connection point Nb (or Na) of the regeneration circuit $\overline{RC}$ (or RC) is charged up to $V_{DD}+V_{TH}$ or more by the capacitor Cb (or Ca) when the regeneration pulse $\phi_{REF}$ becomes "1" in level. Accordingly, the higher potential data line is charged up to its maximum voltage $V_{DD}$ through the transistor T9b (or T9a) in the regeneration circuit $\overline{RC}$ (or RC). In this way, the signal voltage on the higher potential data line is raised to make it easy to sense the data.

The signal voltage difference between the data lines DL and $\overline{DL}$ when the sense amplifier SA is operated is very small, 20 to 200 mV. Therefore, to correctly sense the data by the sense amplifier, it is necessary to set the potentials (initial potentials) on the data lines DL and $\overline{DL}$ to substantially the same value before the sensing operation. For example, when a signal voltage difference between the data lines DL and $\overline{DL}$ is 50 mV, and the setting value difference between the same data lines is 20 mV, the actual signal voltage is reduced almost half.

The initial potential setting is of great significance at the present day, because the signal voltage is reduce a further lower with increase of the memory capacity and with the precharge cycle period (normally 100 μs or so) being shorter with requirement of the high operation speed.

To reliably set the initial potentials on the data lines DL and $\overline{DL}$, it might be a satisfactory measure to increase conductances of the transistors T2 and T3 of the sense amplifier SA. This measure, however, is accompanied by increase of the capacitances of the transistors T2 and T3 of the sense amplifier SA against ground. To avoid this, the capacitance of the capacitor for bootstrap in the precharge pulse generation circuit shown in FIG. 3 must be set large. The large capacitor Cp makes it difficult to generate the precharge pulse $\phi_p$ and increases the necessary chip area when the memory device is integrated in fabrication.

SUMMARY OF THE INVENTION

Accordingly, an object of the present invention is to provide a semiconductor memory device which can reliably set the initial potentials on a pair of data lines, thereby eliminating an increase of chip area and the difficulty of generating the precharge pulse.

According to the present invention, there is provided a semiconductor device comprising: a pair of first and second data lines charged to a predetermined potential during a precharge period; sense amplifier means for sensing a potential of said pair of first and second data lines during an active period provided between the pair of said first and second data lines; and regeneration means provided for said first and second data lines which operate to form at least one of a charge path to said first and second data lines and a short circuit path for short circuiting said first and second data lines during said precharge period and to make the potential of the one of the data lines which is closer to said predetermined potential than that of the other data line, approximate to said predetermined potential.

BRIEF DESCRIPTION OF THE DRAWINGS

FIGS. 2A to 2F are waveforms of potential changes at leading portions in the circuit diagram shown in FIG. 1;

FIG. 3 is a circuit diagram of a precharge pulse generation circuit;

DETAILED DESCRIPTION OF THE PREFERRED EMBODIMENTS

Figure 1:
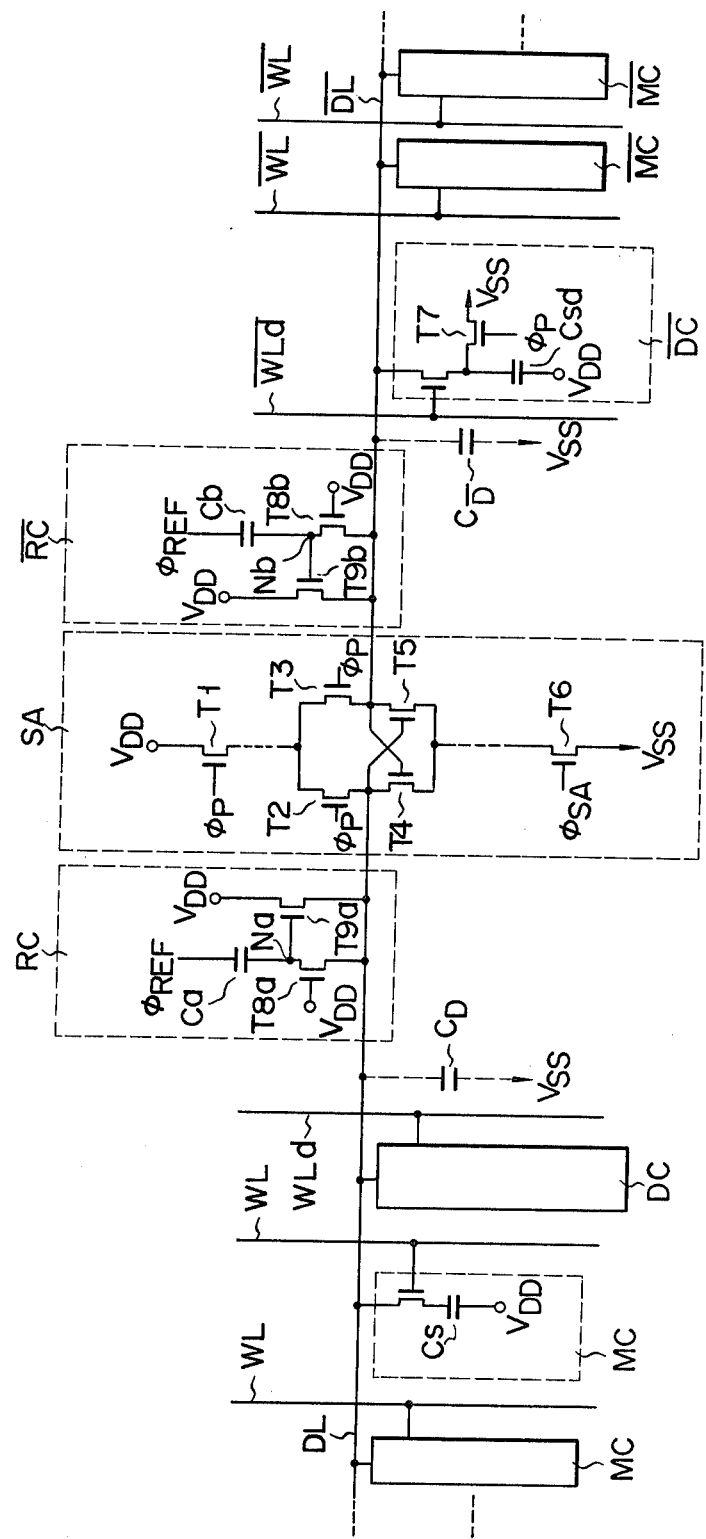
FIG. 1 is a circuit diagram of a prior MOS type dynamic memory device.
Figure 4:
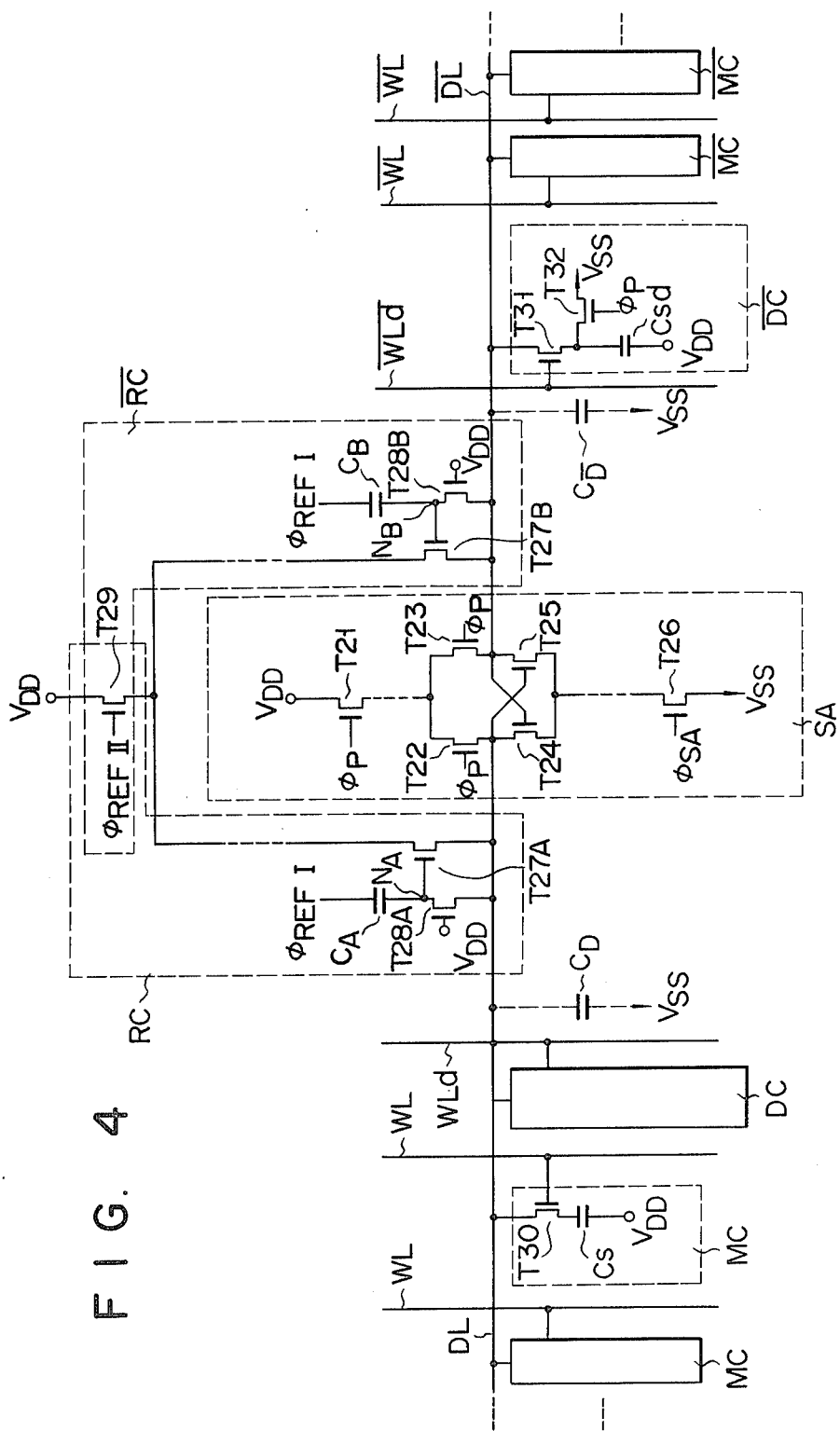
FIG. 4 is a circuit arrangement illustrating an embodiment of a semiconductor memory device according to the present invention.

FIG. 4 shows an embodiment of a semiconductor memory device according to the present invention. FIGS. 5A to 5F illustrate signal waveforms at the major portions of the semiconductor memory device shown in FIG. 4. In FIG. 4, DL and $\overline{DL}$ designate a pair of data lines and all transistors used in the embodiment are of N channel and enhancement type. Transistors T21, T22, T23, T24, T25 and T26 make up a sense amplifier. Transistors T27A and T28A, capacitor $C_A$, and transistor T29 make up a regeneration circuit RC on the data line DL side. Transistors T27B and T28B, capacitor $C_B$, and transistor T29 make up a regeneration circuit $\overline{RC}$ on the data line $\overline{DL}$.

A transistor T30 and a capacitor Cs make up a memory cell MC. Transistors T31 and T32, and a capacitor Csd make up a dummy memory cell $\overline{DC}$.

The construction of the sense amplifier will be described in detail. The transistors T21 is for applying a high potential power source voltage $V_{DD}$. The drain of the transistor T21 is connected to the power source $V_{DD}$ and at its source to the drains of the transistors T22 and T23. A precharge pulse $\phi_p$ (FIG. 5B) is applied to the gate of the transistor T21. The transistors T22 and T23 are for charging and shorting the data lines DL and $\overline{DL}$.

The source of the transistor T21 is connected to the data lines DL and $\overline{DL}$. Thus, the transistors T22 and T23 form charging paths to the data lines DL and $\overline{DL}$ and short circuiting paths for short circuiting these data line. The precharge pulse $\phi_p$ is applied to both the gates of the transistors T22 and T23.

Cross-connected transistors T24 and T25 are used for voltage amplification or data detection. The transistor T24 is connected at the drain to the data line DL and at the gate to the data line $\overline{DL}$. The drain of the transistor T25 is connected to the data line $\overline{DL}$ and at the gate to the data line DL. The sources of the transistors T24 and T25 are connected together with the drain of the transistor T26 for the sense amplifier. The source of the transistor T26 is coupled with the power source voltage $V_{SS}$ ("0" level). The drive pulse $\phi_{SA}$ (FIG. 5D) is applied to the gate of the transistor T26.

Although the single sense amplifier is illustrated in the drawing, a plurality of such sense amplifiers, in an actual case, are incorporated in a semiconductor memory device. In this case, the transistors T22 and T23 must be fabricated into the memory device for each sense amplifier SA, while the transistor T21 for applying the high potential voltage $V_{DD}$ and the transistor T26 for discharging to the low potential voltage $V_{SS}$ are not necessarily provided for each sense amplifier, but may be provided commonly for the respective sense amplifiers. When the memory capacity of the semiconductor memory device is 16 K bits, for example, the number of the sense amplifiers is 128. Transistors T21, T26 may be provided commonly for the 128 sense amplifiers.

Figure 5:
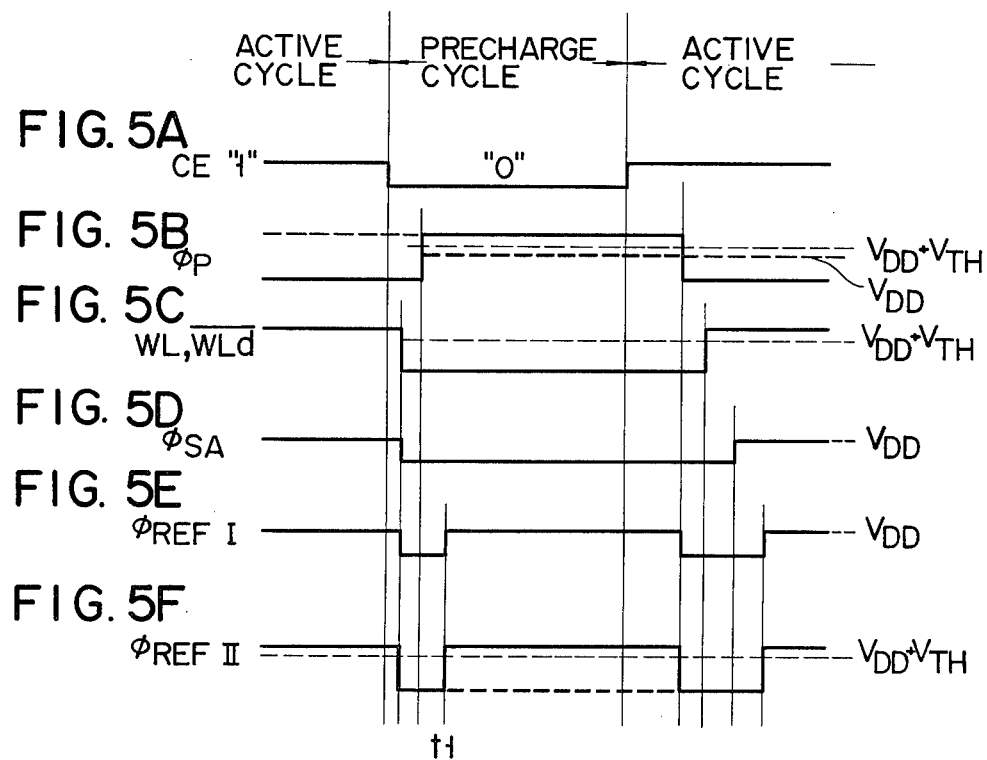
FIGS. 5A to 5F are waveforms of potential changes at the leading portions in the semiconductor device shown in FIG. 4.

The construction of the regeneration circuit RC will be described. The transistor T29 is for applying a high voltage power source voltage $V_{DD}$. The drain of the transistor T29 is connected to the power source voltage $V_{DD}$ and T29's source is connected to the drain of the transistor T27A. The regeneration pulse $\phi_{REF\,II}$ (FIG. 5F) is applied to the gate of the transistor T29. The transistor T28A is connected at the source to the data line DL and at the gate to the power source voltage $V_{DD}$. A common node $N_A$ between the gate of the transistor T27A and the drain of the transistor T28A is connected to one end of the capacitor $C_A$. The other end of the capacitor $C_A$ is coupled with a regeneration pulse $\phi_{REF\,I}$ (FIG. 5E).

The drain and the source of the barrier transistor T28A may be replaced with each other according to the voltage. Since, an initial time of the precharge period the common node $N_A$ is charged through the data line DL, the data line DL is connected to the drain and the common node $N_A$ is connected to the source.

The construction of the regeneration circuit $\overline{RC}$ will be described. The transistor T29 used for the regeneration circuit RC is also used for the same purpose in the regeneration circuit $\overline{RC}$. The transistor T29 is connected at the source to the drain of the transistor T27B of which the source is connected to the data line $\overline{DL}$. The transistor T27B is connected at the gate to the drain of the barrier transistor T28B and at the source to the data line $\overline{DL}$. A common node between the gate of the transistor T27B and the drain of the transistor T28B is connected at one end of the capacitor $C_B$ of which the other end is coupled with the regeneration pulse $\phi_{REF\,I}$ (FIG. 5E). As in the regeneration circuit RC, the drain and source of the barrier transistor T28B may be replaced with each other also in the regeneration circuit $\overline{RC}$.

A practical construction of the memory cell MC will be described. The transistor T30 is connected at the drain to the data line DL and at the gate to the corresponding word line WL. The source of the transistor T30 is connected to one end of the capacitor Cs of which the other end is coupled with the power source voltage $V_{DD}$ applied. The memory cells have all the same constructions. In the drawing, the construction of the single memory cell is illustrated and the remaining memory cells are indicated by mere blocks. The same thing is true for the dummy memory cells $\overline{MC}$.

A practical arrangement of the dummy cell $\overline{DC}$ will be described. The transistor T31 is connected at the drain to the data line $\overline{DL}$ and at the gate to the dummy word line $\overline{WLd}$. The source of the transistor T31 is connected to one end of the capacitor Csd of which the other end is connected to the power source voltage $V_{DD}$; and also to the drain of the transistor T32. The source of T32 is coupled with the power source voltage $V_{SS}$. The precharge pulse $\phi_p$ is applied to the gate of the transistor T32.

Since the construction of the dummy cell DC is also the same as that of the dummy cell $\overline{DC}$, it is indicated by a block.

In the figure, $C_D$ and $C_{\overline{D}}$ indicate stray capacitors associated with the data lines DL and $\overline{DL}$, respectively. Since a plurality of memory cells MC, $\overline{MC}$ are connected to the data lines DL, $\overline{DL}$ and the stray capacitor $C_D$ or $C_{\overline{D}}$ is considerably larger than the capacitor Cs in the memory cell MC or $\overline{MC}$, $C_{\overline{D}} >> Cs$. The capacitor Csd in the dummy cell DC or $\overline{DC}$ is approximately ½ the capacitor Cs in the memory cell MC or $\overline{MC}$.

The operation of the memory device shown in FIG. 4 will be described referring to FIGS. 5A to 5F illustrating timing charts.

When the chip enable pulse CE (FIG. 5A) changes from "1" to "0" and its operation phase shifts to the precharge cycle, the regeneration pulses $\phi_{REF\,I}$ (FIG. 5E) and $\phi_{REF\,II}$ (FIG. 5F) are "0" in level. Then, when the precharge pulse (FIG. 5B) is "1" in level, the data line DL is charged through the transistors T21 and T22 of the sense amplifier SA, and the data line $\overline{DL}$ is charged through the transistors T21 and T23 of the sense amplifier SA. When the precharge pulse $\phi_p$ is "1", the data lines DL and $\overline{DL}$ are short circuited with each other through the transistors T22 and T23. At t1 when both the data lines DL and $\overline{DL}$ are charged to approximately $V_{DD}-V_{TH}$ ($V_{TH}$ designates the threshold voltage of each transistor T21, T22 and T23), the regeneration pulse $\phi_{REF\,I}$ and $\phi_{REF\,II}$ are both "1".

Also at t1, the common nodes $N_A$ and $N_B$ in the regeneration circuits RC and $\overline{RC}$ are both charged up to approximately $V_{DD}-V_{TH}$. Further, the gate-source voltage of each transistor T28A or T28B is approximately $V_{TH}$, so that the transistors T28A and T28B are almost in an OFF condition. Accordingly, when the regeneration pulse $\phi_{REF\,I}$ becomes "1" in level at the time point t1, the potentials at the common nodes $N_A$ and $N_B$ are both bootstrapped to be boosted to a high potential of $V_{DD+VTH}$ or more. As a result, the transistor T27A of the regeneration circuit RC and the transistor T27B of the regeneration circuit $\overline{RC}$ are turned on, so that the data lines DL and $\overline{DL}$ are interconnected with each other through the transistors T27A and T27B.

At time t1, the regeneration pulse $\phi_{REF\,II}$ is "1" in level, so that the transistor 29 common for the regeneration circuits RC and $\overline{RC}$ is turned on. Accordingly, a charge path to the data line DL through the transistors T29 and T27A is formed, and the same time a charge path to the data line $\overline{DL}$ through the transistors T29 and T27B is formed.

In this way, during the precharge period, the charge and short circuit paths are formed; the charge path formed by the transistors T21, T22 and T23 in the sense amplifier SA, the charge path by the transistors T29, T27A and T27B in the regeneration circuits RC and $\overline{RC}$, the short circuit paths by the transistors T22 and T23 in the sense amplifier SA, and the short circuit path by the transistors T27A and T27B in the regeneration circuits RC and $\overline{RC}$. Therefore, charging the initial potentials on the data lines DL and $\overline{DL}$ to the same value is reliably and quickly performed. For example, when the conductances of the transistors T27A and T27B are substantially equal to those of the transistors T22 and T23, a time required for setting the initial value to the same value is reduced by half. This fact greatly contributes to a high accuracy and stable operation of the sense amplifier SA.

Then, the chip enable pulse CE becomes "1" in level and the operation phase of the memory device shifts to the active cycle. As a result, the regeneration pulse $\phi_{REF\,I}$ and $\phi_{REF\,II}$ return to "0" in level in synchronism with the return of the precharge pulse $\phi_p$ to "0" level. As a result, the setting of the initial potentials on the data lines DL and $\overline{DL}$ to the same value is finished.

After the precharge pulse $\phi_p$ is "0", a single word line WL (FIG. 5C) is selected on the data line DL side, for example. And a dummy word line $\overline{WLd}$ (FIG. 5C) is selected on the data line $\overline{DL}$ side. As a result, the data, i.e. charge, stored in the capacitor Cs in the memory cell MC connected to the word line WL and the capacitor Csd in the dummy cell $\overline{DC}$ connected to the dummy word line $\overline{WLd}$ are respectively read out on the data lines DL and $\overline{DL}$, so that signal voltages caused on the read out data, i.e. the charge, appear on the data lines DL and $\overline{DL}$.

In this case, since the signal voltages caused in accordance with the capacitance ratio of the capacitors Cs and Csd and the stray capacitors $C_D$ and $C_{\overline{D}}$ appear on the data lines DL and $\overline{DL}$, respectively, these signals are very small. Thereafter, the magnitudes of the signal voltages on the data lines DL and $\overline{DL}$ are compared to each other to detect the stored data. Namely, after the signal voltages appear on the data lines DL and $\overline{DL}$, the drive pulse $\phi_{SA}$ (FIG. 5D) becomes "1" in level and the discharge transistor T26 is turned on. Then, the transistors T24 and T25 operate, so that only the lower potential data line of those lines DL and $\overline{DL}$ discharges to "0" in level. The higher potential data line is kept at the higher potential so that the signal voltage on the higher potential data line is amplified and sensed. In this case, when the memory cell MC of the data line DL is selected and the data of the memory cell MC is "0", the low potential data line is the data line DL, while when it is "1", the data line is on the line $\overline{DL}$.

After the operation by the sense amplifier SA, the regeneration pulses $\phi_{REF\,I}$ and $\phi_{REF\,II}$ return to "1" level so that the higher potential data line is regenerated. The potential on the higher potential data line, or the data line not discharged, drops to some extent through the sensing operation of sense amplifier SA. Nevertheless, it is still at relatively high potential. For this reason, the gatesource voltage of the barrier transistor T28B (or T28A) in regeneration circuit $\overline{RC}$ (or RC) is at the threshold voltage or slightly less than that voltage. As a result, the barrier transistor T28B (or T28A) is kept in an OFF state.

Accordingly, the common node $N_B$ (or $N_A$) in the regeneration circuit $\overline{RC}$ (or RC) is boosted to $V_{DD}+V_{TH}$ or more by the capacitor $C_B$ (or $C_A$) when the regeneration pulse $\phi_{REF\,I}$ is "1" in level. Accordingly, the higher potential data line $\overline{DL}$ (or DL) is charged up to the maximum potential, or the power source voltage $V_{DD}$, through the transistor T27B (or T27A) of the regeneration circuit $\overline{RC}$ (or RC). The memory device shown in FIG. 4 operates as mentioned above.

The "1" level potential of the regeneration pulse $\phi_{REF\,I}$ may be the power source voltage $V_{DD}$. The "1" level of the regeneration pulse $\phi_{REF\,II}$ must be $V_{DD}+V_{TH}$ or more in order that the data lines DL and $\overline{DL}$ must be charged up to the power source voltage $V_{DD}$. The transistor T29 supplied with the regeneration pulse $\phi_{REF\,II}$ necessary for the memory device may be only one. Therefore, such pulse may readily be produced.

Also in the present embodiment, the data lines DL and $\overline{DL}$ are charged through the regeneration circuits RC and $\overline{RC}$ and are short circuited to each other. After the data lines DL and $\overline{DL}$ are charged up to a value near the $V_{DD}-V_{TH}$ through the transistors T21, T22 and T23 of the sense amplifier SA and the regeneration circuits RC and $\overline{RC}$ are operated, the data lines DL and $\overline{DL}$ may be charged up to the power source voltage $V_{DD}$. Therefore, "1" level of the precharge pulse $\phi_p$ may be the power source voltage $V_{DD}$. Consequently, the precharge pulse $\phi_p$ can readily be obtained.

Alternatively, the regeneration pulse $\phi_{REF\,II}$ may be set at "0" level during a period that the precharge pulse $\phi_p$ is at "1" level, as indicated by a bold dotted line in FIG. 5F so that the charge paths to the data lines DL, $\overline{DL}$ through the transistors T29, T27A and T27B are not formed, but only the short circuit path through the transistors T27A and T27B is formed.

Figure 6:
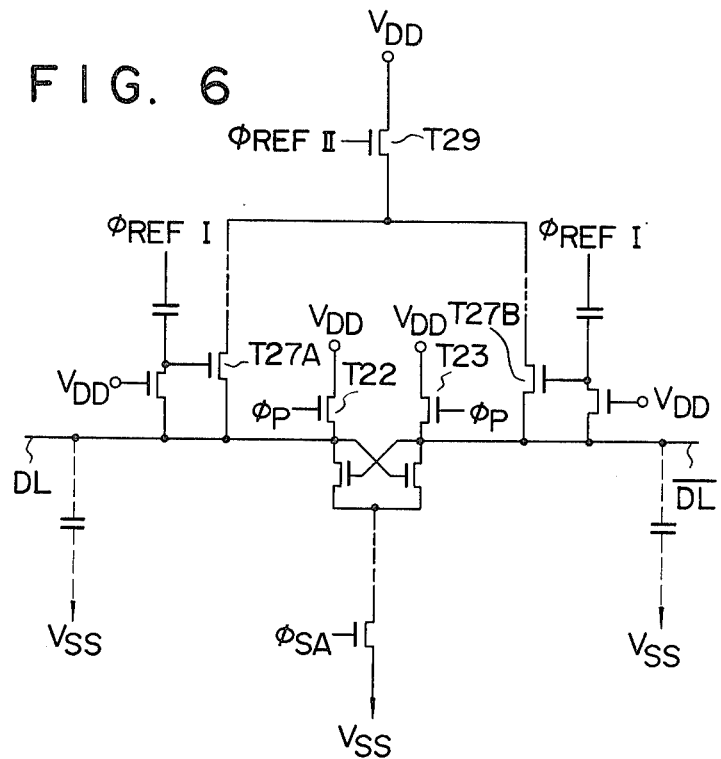
FIG. 6 is a circuit diagram illustrating an embodiment of a sense amplifier circuit according to the present invention.

FIG. 6 shows another embodiment of a semiconductor memory device according to the present invention. In the present embodiment, the transistor T21 for the voltage supply in the sense amplifier SA is omitted. The transistors T22 and T23 are directly connected to the power source voltage $V_{DD}$, not through the transistor T21. The remaining in the construction is the same as that of the circuit shown in FIG. 4. Accordingly, like numerals are used for designating like portions in FIG. 4.

In the present embodiment, the data lines DL and $\overline{DL}$ are precharged through the transistors T22 and T23 to boost the common nodes $N_A$ and $N_B$ in the regeneration circuits RC and $\overline{RC}$, which are charged together with the data lines DL and $\overline{DL}$. The data line DL is charged through the charge path including the transistors T29 and T27A. The data line $\overline{DL}$ is charged through the discharge path including the transistors T29 and T27B. Through the short circuit path by the transistors T27A and T27B, the data lines DL and $\overline{DL}$ are interconnected with each other. Accordingly, no short circuit path by the transistors T22 and T23 is formed, unlike the embodiment shown in FIG. 4.

Figure 7:
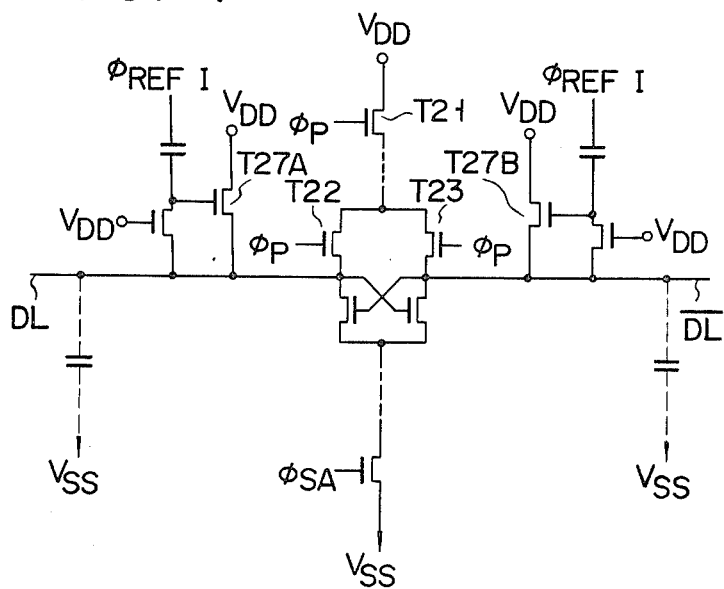
FIG. 7 is a circuit diagram illustrating an embodiment of a regeneration circuit according to the present invention.

FIG. 7 shows another embodiment of a semiconductor memory device according to the present invention. In the present embodiment, the transistor T29 shown in FIG. 4 is omitted. The transistors T27A and T27B are directly connected to the power source voltage $V_{DD}$ not through the transistor T29. Accordingly, there is no short circuit path by the transistors T27A and T27B, and the interconnection between the data lines DL and $\overline{DL}$ is made by only the short circuit path by the transistors T22 and T23. The charge is made through a charge path passing through the transistor T27A, a charge path passing through the transistor T27B, and charge paths passing through the transistors T21 and T22 and the transistors T21 and T23.

Figure 8:
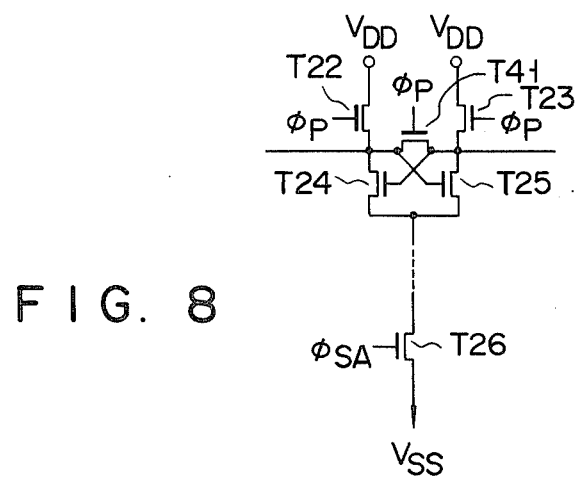
FIG. 8 is a circuit diagram illustrating another embodiment of a sense amplifier according to the present invention.

It will be understood that the present invention is not limited to the above-mentioned embodiments. For example, as shown in FIG. 8, the transistor T21 is omitted and there may be provided between the data lines DL and $\overline{DL}$ a short circuiting transistor T41 whose gate receives the precharge pulse $\phi_p$.

Figure 9:
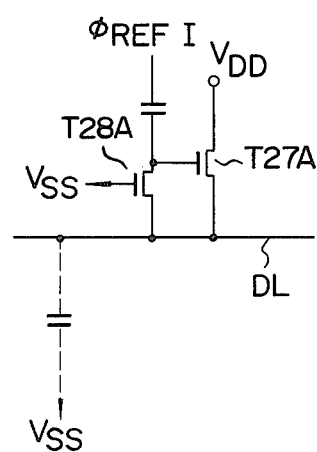
FIGS. 9 and 10 are circuit diagram illustrating other embodiments of a regeneration circuit according to the present invention.

The regeneration circuit RC may be modified to an arrangement as shown in FIG. 9 in which the transistor T28A shown in FIG. 4 is replaced by a transistor of the depletion type whose gate receives the low potential power source voltage $V_{SS}$.

Figure 10:
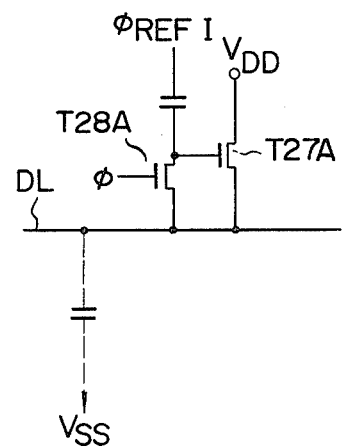

As shown in FIG. 10, a proper pulse $\phi$ in synchronism with the pulses $\phi_{REF\,I}$ and $\phi_{REF\,II}$, is applied to the gate at transistor T28A in place of the higher potential power source voltage $V_{DD}$. With the application of such pulses, the stray capacitance $C_D$ when the sense amplifier SA is operated may be reduced.

As seen from the foregoing description, in the present invention, also at the time of setting the initial potentials on the pair of data lines to the same potential, the regeneration circuit is operated to charge and/or short the pair of data lines through the regeneration circuit. With this construction of the semiconductor memory, the initial potentials on the pair of data lines can reliably and quickly be set to the same value, without the difficulty of the generation of the precharge pulse.

What is claimed is:

1. A semiconductor device comprising: a first source of power;
   a pair of first and second data lines charged to a predetermined potential during a precharge period;
   sense amplifier means coupled to said first power source for sensing, during an active period, a potential between the pair of said first and second data lines; and
   regeneration means coupled to said first power source and connected to said first and second data lines for charging said first and second data lines to said predetermined potential during said precharge period and for maintaining the potential of the one of the data lines having a higher potential after said sense amplifier senses during said active period.

2. A semiconductor memory device according to claim 1 wherein said regeneration means comprises:
   (a) a first transistor which is coupled at its drain to said first power source and which receives at its gate a pulse signal having a low level during said precharge period;
   (b) second and third transistors which are connected at their drains to the source of said first transistor and at their sources to said first and second data lines;
   (c) a fourth transistor which is connected at one of the drain and source electrodes to the gate of said second transistor and at the other electrode to said first data line;
   (d) a fifth transistor which is connected at one of the drain and source electrodes to the gate of said third transistor and at the other electrode to said second data line;
   (e) a first capacitor element which is connected at one end to the gate of said second transistor and receives at the other end of first pulse signal having a high level during said precharge period; and
   (f) a second capacitor element which is connected at one end to the gate of said third transistor and receives at the other end said first pulse signal.

3. A semiconductor memory device according to claim 1 wherein said regeneration means comprises:
   (a) first and second transistors coupled at their drains to said first power source and at their sources to said first and second data lines;
   (b) a third transistor which is connected at one of the drain and source electrodes to the gate of said first transistor and at the other electrode to said first data line;
   (c) a fourth transistor which is connected at one of the drain and source electrodes to the gate of said second transistor and at the other electrode to said second data line;
   (d) a first capacitor element which is connected at one end to the gate of said first transistor and receives at the other end a first pulse signal having a high level during said precharge period; and
   (e) a second capacitor element which is connected at one end to the gate of said second transistor and receives at the other end said first pulse signal.

4. A semiconductor memory device according to claim 3, wherein said transistors are all of the enhancement type and said third and said fourth transistors are coupled at their gates to said first power source.

5. A semiconductor memory device according to claim 3, wherein said transistors are all of the enhancement type and said third and said fourth transistors are coupled at their gates to a second pulse signal which is in synchronism with said first pulse signal applied to said first and second capacitor elements.

6. A semiconductor memory device according to claim 3, wherein said first and second transistors are of the enhancement type, and said third and fourth transistors are of the depletion type and coupled at their gates to a second power source.

7. A semiconductor memory device according to claim 1 wherein said regeneration means comprises:
   (a) a first transistor which is coupled at its drain to said first power source, and which receives at its gate a pulse signal having a high level during said precharge period;
   (b) second and third transistors which are connected at their drains to the source of said first transistor and at their sources to said first and second data lines;
   (c) a fourth transistor which is connected at one of the drain and source electrodes to the gate of said second transistor and at the other electrode to said first data line;
   (d) a fifth transistor which is connected at one of the drain and source electrodes to the gate of said third transistor and at the other electrode to said second data line;
   (e) a first capacitor element which is connected to the gate of said second transistor and receives at the other end a first pulse signal having a high level during said precharge period; and
   (f) a second capacitor element which is connected at one end to the gate of said third transistor and receives at the other end first pulse signal.

8. A semiconductor memory device according to claim 1 wherein said regeneration means includes means for short circuiting said first and second data lines.

9. A semiconductor memory device according to claim 1 wherein said regeneration means includes means for forming a charge path to said first and second data lines during said precharge period.

10. A semiconductor memory device according to any one of claims 1, 2, 3 or 7 wherein said sense amplifier means comprises:
    (a) a first sense amplifier transistor which is connected at its drain to said first power source and receives at its gate a precharge pulse;
    (b) second and third sense amplifier transistors which are connected at their drains to the source of said first sense amplifier transistor, at their sources to said first and second data lines, and receive at their gates said precharge pulse;
    (c) a fourth sense amplifier transistor which is connected at its drain to said first data line and at its gate to said second data line;

(d) a fifth sense amplifier transistor which is connected at its drain to said second data line and at its gate to said first data line;

(e) a second source of power; and (f) a sixth sense amplifier transistor which is connected at its drain to the sources of said fourth and fifth sense amplifier transistors, is coupled at its source to said second power source, and receives at its gate a drive pulse.

11. A semiconductor memory device according to any one of claims 1, 2, 3 or 7 wherein said sense amplifier means comprises:

(a) first and second sense amplifier transistors which are coupled at their gates to said first power source, are connected at their sources to said first and second data lines, and receive at their gates a precharge pulse;

(b) a third sense amplifier transistor which is connected at its drain to said first data line and at its gate to said second data line;

(c) a fourth sense amplifier transistor which is connected at its drain to said second data line and at the gate to said first data line;

(d) a second source of power; and (e) a fifth sense amplifier transistor which is connected at its drain to the sources of said third and fourth sense amplifier transistors, is coupled at its source to said second power source and receives at its gate a drive pulse.

12. A semiconductor memory device according to any one of claims 1, 2, 3 or 7 wherein said sense amplifier means comprises:

(a) first and second sense amplifier transistors which are coupled at their drains to said first power source, are connected at their sources to said first and second data lines, and receive at their gates a precharge pulse;

(b) a third sense amplifier transistor which is connected at its drain to said first data line and at its gate to said second data line;

(c) a fourth sense amplifier transistor which is connected at its drain to said second data line and at its gate to said first data line;

(d) a fifth sense amplifier transistor which is connected at one of the drain and source electrodes to said first data line and at the other electrode to said second data line;

(e) a second source of power; and (f) a sixth sense amplifier transistor which is connected at its drain to the sources of said third and fourth sense amplifier transistors, coupled at its source to said second power source, and receives at its gate a drive pulse.

13. A semiconductor memory device according to claim 2 or 7, wherein said transistors are all of the enhancement type and said fourth and fifth transistors are coupled at their gates to said first power source.

14. A semiconductor memory device according to claim 2 or 7, wherein said transistors are all of the enhancement type and said fourth and fifth transistors are coupled at their gates to a second pulse signal which is in synchronism with said first pulse signal applied to said first and second capacitance elements.

15. A semiconductor memory device according to claim 2 or 7, wherein said first to third transistors are of the enhancement type, and said fourth and fifth transistors are of the depletion type and coupled at their gates with a second power source.

16. A semiconductor device comprising:

first and second sources of power:

a pair of first and second data lines charged to a predetermined potential during a precharge period;

regeneration means including first transistor which is coupled at its drain to said first power source, receives at its gate a first pulse signal having a high level period during said precharge period, second and third transistors which are connected at their drains to the source of said first transistor, and at their sources to said first and second data lines, a fourth transistor which is connected at one of the drain and source electrodes to the gate of said second transistor, at the other electrode to said first data line, and has at its gate said first power source, a fifth transistor which is connected at one of the drain and source electrodes to the gate of said third transistors, at the other electrode to said second data line, and has at its gate the first power source, a first capacitor element which is connected at one end to the gate of said second transistor and receives at the other end a second pulse signal having a high level during said precharge period, and a second capacitor element which is connected at one end to the gate of said third transistor and receives at the other end said second pulse signal; and sense amplifier means including a sixth transistor which is connected at its drain to the first power source, and at its gate to a precharge pulse, seventh and eighth transistors which are connected at their drains to the source of said sixth transistor, at their sources to said first and second data lines, and receive at their gates said precharge pulse, a ninth transistor which is connected at its drain to said first data line and at its gate to said second data line, a tenth transistor which is connected at its drain to said second data line and at its gate to said first data line, and an eleventh transistor which is connected at its drain to the sources of said ninth and tenth transistors, coupled at its source to said second power source and receives at its gate a drive pulse.

* * * * *